US011716886B2

(12) United States Patent
Yang et al.

(10) Patent No.: US 11,716,886 B2
(45) Date of Patent: Aug. 1, 2023

(54) DISPLAY DEVICE

(71) Applicant: Samsung Display Co., Ltd., Yongin-Si (KR)

(72) Inventors: Hui-Won Yang, Seoul (KR); Kyumin Kim, Suwon-si (KR); Jaeseol Cho, Seoul (KR); Jongmoo Huh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 23 days.

(21) Appl. No.: 17/410,274

(22) Filed: Aug. 24, 2021

(65) Prior Publication Data

US 2022/0157912 A1    May 19, 2022

(30) Foreign Application Priority Data

Nov. 17, 2020  (KR) .......................... 10-2020-0154125

(51) Int. Cl.
*H10K 59/131* (2023.01)
*H10K 59/121* (2023.01)
*H01L 27/12* (2006.01)

(52) U.S. Cl.
CPC ....... *H10K 59/131* (2023.02); *H10K 59/1213* (2023.02); *H01L 27/1225* (2013.01)

(58) Field of Classification Search
CPC ............. Y10S 345/905; Y10S 493/944; H04N 2201/0089; H01L 27/3262; H01L 227/32; H01L 27/3244; H01L 27/3241; H01L 27/28; H01L 27/1225; H01L 27/1222; H01L 27/1214; H01L 27/3276

USPC .......................................................... 257/43
See application file for complete search history.

(56) References Cited

U.S. PATENT DOCUMENTS

| 7,679,131 | B1 * | 3/2010 | Kawasaki | ........... H01L 27/1274 257/327 |
| 2015/0129844 | A1 * | 5/2015 | Kang | ................... H01L 29/0657 257/43 |
| 2016/0284856 | A1 * | 9/2016 | Shimomura | ........ H01L 27/1225 |
| 2018/0158843 | A1 * | 6/2018 | Lius | ................... G02F 1/134309 |
| 2018/0233596 | A1 * | 8/2018 | Ohara | ............... H01L 29/42356 |
| 2020/0326571 | A1 * | 10/2020 | Hanada | ............... H01L 27/3244 |
| 2020/0357825 | A1 * | 11/2020 | Yoshida | ............. H01L 29/7869 |
| 2021/0074736 | A1 * | 3/2021 | Hanada | ............. G02F 1/136227 |

FOREIGN PATENT DOCUMENTS

| KR | 1019970053546 | A |   | 7/1997 |   |
| KR | 1020160096752 | A |   | 8/2016 |   |
| KR | 101865840 | B1 |   | 6/2018 |   |
| KR | 102003359 | B1 |   | 7/2019 |   |
| KR | 1020200032405 | A |   | 3/2020 |   |
| WO | WO-2019138734 | A1 | * | 7/2019 | ........... G02F 1/1368 |

* cited by examiner

*Primary Examiner* — Marcos D. Pizarro
*Assistant Examiner* — Li-Chun Tung
(74) *Attorney, Agent, or Firm* — Cantor Colburn LLP (57) ABSTRACT

A display device includes a lower electrode extending in a first direction and a first active layer disposed on the lower electrode and extending in a second direction perpendicular to the first direction. The first active layer includes a first area having a first width in the first direction, a second area having a second width wider than the first width in the first direction, and overlapping the lower electrode and a third area between the first area and the second area and connecting the first area to the second area.

19 Claims, 12 Drawing Sheets

DISPLAY DEVICE

This application claims priority to Korean Patent Application No. 10-2020-0154125, filed on Nov. 17, 2020, and all the benefits accruing therefrom under 35 U.S.C. § 119, the content of which in its entirety is herein incorporated by reference.

BACKGROUND

1. Field

Embodiments of the invention relate to a display device. More specifically, embodiments of the invention relate to a display device including an active layer.

2. Description of the Related Art

A display device may include a display area and a non-display area. The display device may include a plurality of driving units (for example, data driver, gate driver, and the like) disposed in the non-display area. The driving units may transmit a data signal, a gate signal, and the like to the pixels.

The display device may display an image through a plurality of pixels disposed in the display area and organic light emitting diodes connected to the pixels. Such a display device may display the image through the organic light emitting diodes after the pixels receive signals from the driving units.

The display device may include an active layer, a plurality of conductive layers, and a plurality of insulating layers to transfer the signals to the pixels.

SUMMARY

In an display device including an active layer, a plurality of conductive layers, and a plurality of insulating layers to transfer signals to pixels, the active layer may be eroded in a process of forming the active layer, conductive layers and insulating layers. Accordingly, it is desired to prevent the active layer from being eroded in a process of forming.

Embodiments of the invention provide a display device including an active layer.

An embodiment of a display device according to the invention includes a lower electrode extending in a first direction and a first active layer disposed on the lower electrode and extending in a second direction perpendicular to the first direction. In such an embodiment, the first active layer includes a first area having a first width in the first direction, a second area having a second width wider than the first width in the first direction, and overlapping the lower electrode and a third area between the first area and the second area and connecting the first area to the second area.

In an embodiment, the third area may have a width in the first direction increasing as being away from the first area to the second area.

In an embodiment, the third area partially may overlap the lower electrode.

In an embodiment, the first active layer may include an oxide-based semiconductor material, and the lower electrode may include copper and titanium.

In an embodiment, the first active layer may include indium-gallium-zinc oxide.

In an embodiment, the first active layer may have electrical conductivity as a whole.

In an embodiment, the display device may further include a second active layer disposed in a same layer as the first active layer, a first insulating layer in contact with the second active layer and disposed while covering the second active layer, a gate electrode disposed on the first insulating layer and partially overlapping the second active layer and a second insulating layer disposed on the first insulating layer while covering the gate electrode.

In an embodiment, the second active layer may include an oxide-based semiconductor material.

In an embodiment, the second active layer may include indium-gallium-zinc oxide.

In an embodiment, the first active layer may include a center portion overlapping the gate electrode and first and second end portions spaced apart from each other with the center portion therebetween, and having electrical conductivity.

In an embodiment, the first and second end portions of the second active layer may be electrically connected to each other through the center portion when a signal is applied to the gate electrode.

In an embodiment, the display device may further include a drain electrode connected to the second active layer and a light emitting element connected to the drain electrode.

In an embodiment, the display device may further include a contact electrode between the drain electrode and the light emitting element and connecting the drain electrode and the light emitting element to each other.

In an embodiment, the second insulating layer may be in contact with the first active layer, and may cover the first active layer.

In an embodiment, the first active layer may further include a fourth area spaced apart from the third area by the second area and a fifth area between the second area and the fourth area and connecting the second area and the fourth area to each other.

In an embodiment, at least a part of the fifth area may overlap the lower electrode.

In an embodiment, the fourth area may have a third width in the first direction smaller than the second width, and the fifth area may have a width in the first direction increasing as being away from the fourth area to the second area.

In an embodiment, the first width and the third width may be substantially the same as each other.

In an embodiment, the first width and the third width may be different from each other.

Embodiments of a display device according to the invention includes a lower electrode extending in a first direction, and a first active layer disposed on the lower electrode and extending in a second direction perpendicular to the first direction. In such embodiments, the first active layer may include a first area having a first width in the first direction, a second area having a second width greater than the first width in the first direction and overlapping the lower electrode, and a third area connecting the first area to the second area between the first area and the second area. In such embodiments, the third area may have a width increased in the first direction from the first area to the second area, and the third area may partially overlap the lower electrode.

Accordingly, in such embodiments of the display device, a concave portion may not be formed in an area adjacent to the first active layer and the lower electrode, and an etching solution may be prevented from permeating into the first active layer. Therefore, the first active layer may be prevented from being damaged.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
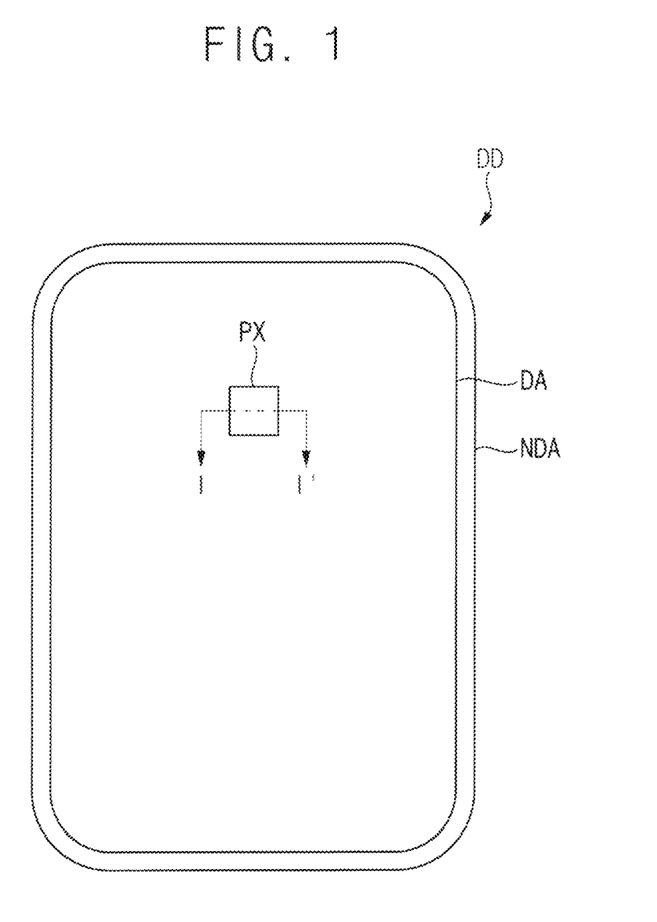
FIG. 1 is a plan view showing a display device according to an embodiment of the invention.

FIG. 1 is a plan view showing a display device according to an embodiment of the invention.

Referring to FIG. 1, an embodiment of the display device DD may include a display area DA and a non-display area NDA. In an embodiment, as shown in FIG. 1, the non-display area NDA may be disposed while surrounding the display area DA. Alternatively, the non-display area NDA may be disposed only on at least one side of the display area DA. In one embodiment, for example, the non-display area NDA may be disposed while surrounding three side surfaces of the display area DA.

A plurality of pixels PX may be disposed in the display area DA. The pixels PX may be disposed over a whole portion of the display area DA to display an image on the display area DA. In one embodiment, for example, the pixels PX may be disposed over a whole portion of the display area DA in a matrix form. In each corner portion having a curvature of the display area DA, the pixels PX may be disposed in a stepwise manner along the curvature of the corner portions. In such an embodiment, the pixels PX may be disposed in various forms in the display area DA.

A plurality of driving units may be disposed in the non-display area NDA. In one embodiment, for example, a gate driving unit, a light emitting control driving unit, and a data driving unit may be disposed in the non-display area NDA. The driving units may provide a signal for driving the pixels PX. In one embodiment, for example, the gate driving unit may provide gate signals for activating transistors. The data driving unit may provide a data signal to each of the pixels PX. In such an embodiment, the light emitting control driving unit may provide a light emitting control signal to each of the pixels PX.

FIG. 1 shows an embodiment where each corner portion of the display device DD has the curvature, but the invention is not limited thereto. In one embodiment, for example, the display device DD may have a polygonal shape including a quadrangle shape. In an embodiment, the display device DD may have a shape having a curvature as a whole. In such an embodiment, the display device DD may have a shape such as a circle or an oval.

Figure 2:
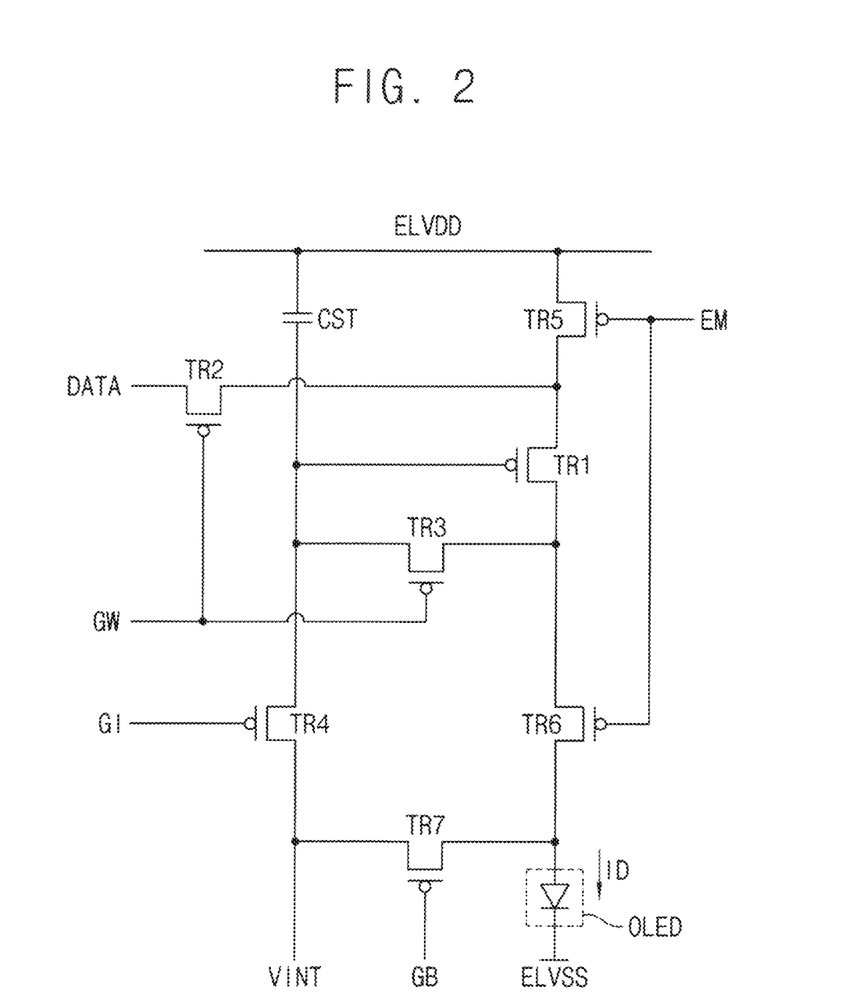
FIG. 2 is a circuit diagram showing a pixel circuit and an organic light emitting diode included in the display device of FIG. 1.

FIG. 2 is a circuit diagram showing a pixel circuit and an organic light emitting diode included in the display device of FIG. 1.

Referring to FIGS. 1 and 2, an embodiment of the display device DD may include a plurality of pixels PX, and each of the pixels PX may include a pixel circuit including at least one transistor and at least one capacitor, and a light emitting element connected to the pixel circuit. In one embodiment, for example, pixel circuit may include seven transistors TR1, TR2, TR3, TR4, TR5, TR6, and TR7 and one capacitor CST. However, this is merely exemplary. The pixel circuit may include three transistors and one capacitor. Alternatively, the pixel circuit may include two or more capacitors.

In an embodiment, the pixel circuit may be connected to the light emitting element. In one embodiment, for example, the light emitting element may be an organic light emitting diode OLED. In such an embodiment, the pixel circuits of each of the pixels PX may be connected to the organic light emitting diode OLED.

Various signals may be transmitted to the pixels PX, and various voltages may be applied thereto. In one embodiment, for example, a data signal DATA, gate signals GW, GI, and GB, and a light emitting control signal EM may be provided to each of the pixels PX. In such an embodiment, an initial voltage VINT, a high power voltage ELVDD and a low power voltage ELVSS may be applied to each of the pixels PX. Each of the pixels PX may emit light through the organic light emitting diode OLED based on the signals and voltages. However, types of the signals transmitted to the pixels PX and voltages applied to the pixels PX are not limited thereto and may be variously implemented or modified.

In one embodiment, for example, the display device DD may provide the gate signals GW, GI, and GB, so that the transistors TR1, TR2, TR3, TR4, and TR7 may be activated. A first gate signal GW may activate the second transistor TR2 and the third transistor TR3. In such an embodiment, the light emitting control signal EM may activate the transistors TR5 and TR6. In one embodiment, for example, when the fifth transistor TR5 is activated by the light emitting control signal EM, the high power voltage ELVDD may be applied to the first transistor TR1.

Figure 3:
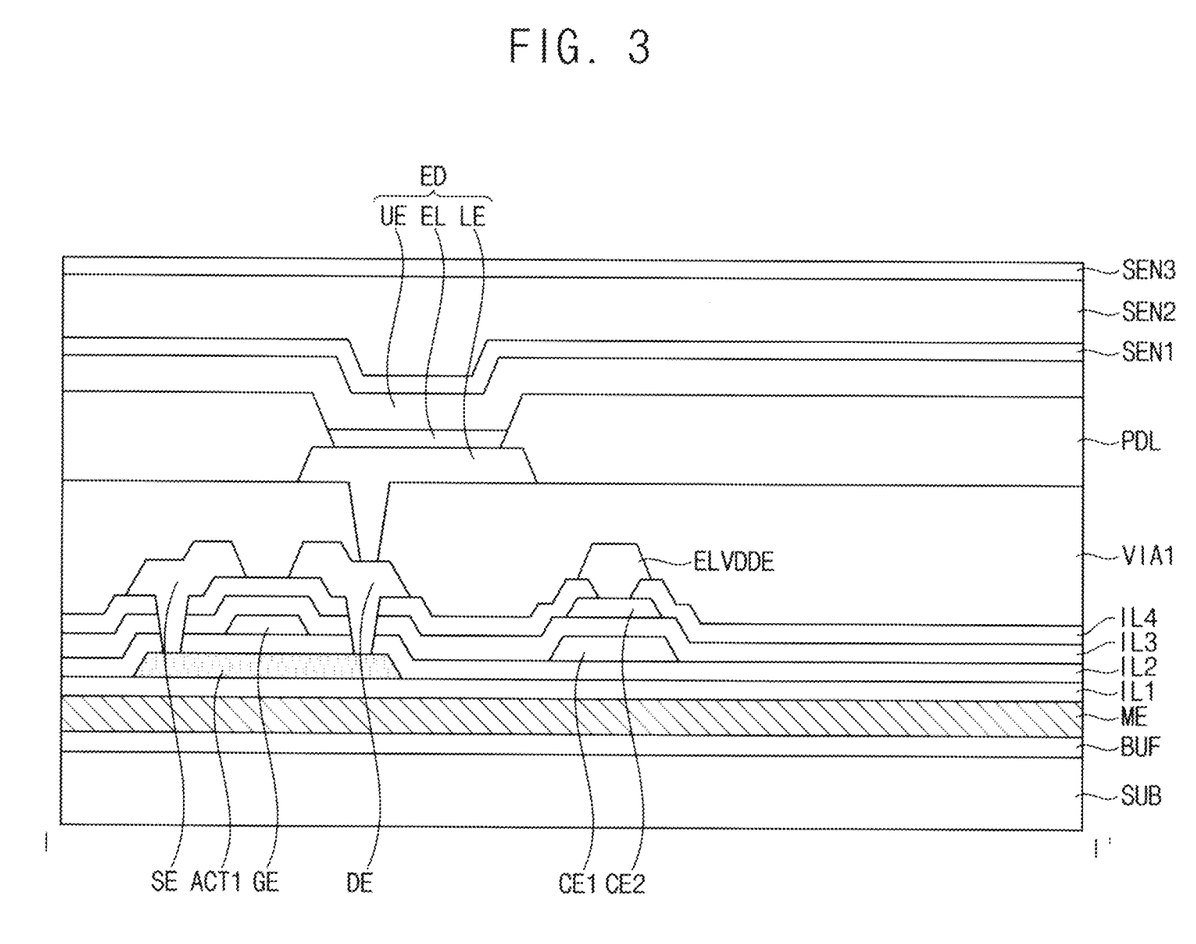
FIG. 3 is a cross-sectional view taken along line I-I' of FIG. 1 showing an embodiment of a display device.

FIG. 3 is a cross-sectional view taken along line I-I' of FIG. 1 showing an embodiment of a display device.

Referring to FIGS. 1 to 3, an embodiment of the display device DD may include a substrate SUB, a buffer layer BUF, a lower electrode layer ME, a first insulating layer IL', a second insulating layer IL2, a third insulating layer IL3, a fourth insulating layer IL4, a first via insulating layer VIA1, a source electrode SE, a drain electrode DE, a gate electrode GE, an active layer ACT, a first capacitor electrode CE1, a second capacitor electrode CE2, a high power voltage electrode ELVDDE, a high power voltage line ELVDDL, a light emitting diode ED, a pixel defining layer PDL, and an encapsulation layer. The light emitting element ED may refer to an organic light emitting diode. The light emitting element ED may include a pixel electrode LE, a light emitting layer EL, and common electrode UE. The encapsulation layer may include or be defined by a first sub-encapsulation layer SEN1, a second sub-encapsulation layer SEN2, and a third sub-encapsulation layer SEN3.

The substrate SUB may be disposed over a whole portion of the display area DA and the non-display area NDA. The substrate SUB may serve to support components disposed thereon. In an embodiment, the substrate SUB may be a rigid substrate including a rigid material such as soft glass or quartz. Alternatively, the substrate SUB may be a flexible substrate including a flexible material such as polyimide ("PI").

The buffer layer BUF may be disposed on the substrate SUB. The buffer layer BUF may prevent external substances (such as moisture and oxygen) permeating through the substrate SUB from permeating into the components disposed thereon. The buffer layer BUF may include at least one selected from silicon oxide (SiOx), silicon nitride (SiNx), silicon oxynitride (SiOxNy), and the like.

The lower electrode ME may be disposed on the buffer layer SUB. The display device DD may transmit a signal to the pixels PX through the lower electrode ME. In one embodiment, for example, the data signal DATA, the low power voltage ELVSS, and the high power voltage ELVDD may be applied to the lower electrode ME. The lower electrode ME may include a conductive material such as metal and alloy. In one embodiment, for example, the lower electrode ME may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The lower electrode ME may be a single film or a laminated film, in which each layer includes at least one selected from the above-listed materials. In one embodiment, for example, the lower electrode ME may include copper (Cu) and titanium (Ti).

In an embodiment, the lower electrode ME may extend in one direction, and at least a part of the lower electrode ME may intersect the active layer.

The first insulating layer IL1 may be disposed on the lower electrode ME. The first insulating layer IL1 may serve to insulate the first active layer ACT1 and the lower electrode ME from each other. The first insulating layer IL1 may include at least one selected from silicon oxide, a metal oxide, and the like. In one embodiment, for example, the first insulating layer IL1 may include at least one selected from silicon oxide, silicon nitride, silicon oxynitride, aluminum oxide, tantalum oxide, hafnium oxide, zirconium oxide, titanium oxide, and the like.

The first active layer ACT1 may be disposed on the first insulating layer IL1. The first active layer ACT1 may form a channel of a thin film transistor. The first active layer ACT1 may include a channel area, a source area, and a drain area. The channel area may be an area of the first active layer ACT1 overlapping the gate electrode, and the source area and the drain area may be opposing end areas of the first active layer ACT1. In such an embodiment, the source area and the drain area may be spaced apart from each other by the channel area.

In an embodiment, the first active layer ACT1 may include an oxide-based semiconductor material. In one embodiment, for example, the first active layer ACT1 may include indium-gallium-zinc oxide ("IGZO"). However, it is merely exemplary. The first active layer ACT1 may include another oxide-based semiconductor material. In one embodiment, for example, the first active layer ACT1 may include at least one selected from indium-zinc-oxide ("IZO"), indium-galium-oxide ("IGO"), and the like.

The second insulating layer IL2 may be disposed on the first insulating layer IL1 while covering the first active layer ACT1. The second insulating layer IL2 may serve to insulate the first active layer ACT1 and the gate electrode GE from each other. The second insulating layer IL2 may include at least one selected from silicon oxide, metal oxide, and the like. In one embodiment, for example, the second insulating layer IL2 may include at least one selected from silicon oxide, silicon nitride, silicon oxynitride, aluminum oxide, tantalum oxide, hafnium oxide, zirconium oxide, titanium oxide, and the like.

The gate electrode GE may be disposed on the first active layer ACT1. The gate electrode GE may overlap the first active layer ACT1. When a signal is applied to the gate electrode GE, the channel area of the first active layer ACT1 may be activated. Accordingly, the source area and the drain area may be electrically connected to each other. The gate electrode GE may include a conductive material such as metal and alloy. In one embodiment, for example, the gate electrode GE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The gate electrode GE may be a single film or a laminated film, in which each layer includes at least one selected from the above-listed materials.

The first capacitor electrode CE1 may be disposed in a same layer as the gate electrode GE. The first capacitor electrode CE1 may include substantially the same material as the gate electrode GE.

The third insulating layer IL3 may be disposed on the second insulating layer IL2 while covering the gate electrode GE and the first capacitor electrode CE1. The third insulating layer IL3 may include at least one selected from silicon oxide, metal oxide, and the like. In one embodiment, for example, the third insulating layer IL3 may include at least one selected from silicon oxide, silicon nitride, silicon oxynitride, aluminum oxide, tantalum oxide, hafnium oxide, zirconium oxide, titanium oxide, and the like.

The second capacitor electrode CE2 may be disposed on the third insulating layer IL3. The second capacitor electrode CE2 may include substantially the same material as the first capacitor electrode CE1. In an embodiment, the second capacitor electrode CE2 may form a capacitor together with the first capacitor electrode CE1. In one embodiment, for example, the first capacitor electrode CE1 may form the storage capacitor CST together with the second capacitor electrode CE2.

In an alternative embodiment, the second capacitor electrode CE2 may be omitted, and the first capacitor electrode CE1 may form the capacitor together with a part of the lower electrode ME.

The fourth insulating layer IL4 may be disposed on the third insulating layer IL3. The fourth insulating layer IL4 may include substantially the same material as the third insulating layer IL3.

The source electrode SE, the drain electrode DE, and the high power voltage electrode ELVDDE may be disposed on the fourth insulating layer IL4. The source electrode SE, the drain electrode DE, and the high power voltage electrode ELVDDE may include a conductive material such as metal and alloy. In one embodiment, for example, the source electrode SE, the drain electrode DE, and the high power voltage electrode ELVDDE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The source electrode SE, the drain electrode DE, and the high power voltage electrode ELVDDE may be a single film or a laminated film, in which each layer includes at least one selected from the above-listed materials.

The source electrode SE and the drain electrode DE may be connected to the first active layer ACT1 respectively through contact holes defined through the second insulating layer IL2, the third insulating layer IL3 and the fourth insulating layer IL4. The source electrode SE may be connected to the source area, and the drain electrode DE may be connected to the drain area. The high power voltage electrode ELVDDE may be connected to the second capacitor electrode CE2 through a contact hole defined through the fourth insulating layer IL4.

The first via insulating layer VIA1 may be disposed on the fourth insulating layer IL4 while covering the source electrode SE, the drain electrode DE, and the high power voltage electrode ELVDDE. The via insulating layer VIA1 may be subjected to a planarization process to have a flat top surface. In an embodiment, the via insulating layer VIA1 may include an organic insulating material. In one embodiment, for example, the via insulating layer VIA1 may include at least one selected from acrylic resin, epoxy resin, phenolic resin, polyamide-based resin, polyimide-based rein, unsaturated polyester-based resin, polyphenylene-based resin, polyphenylenesulfide-based resin, and benzocyclobutene ("BCB").

The light emitting element ED may be disposed on the first via insulating layer VIAL In an embodiment, the light emitting element ED may be the organic light emitting diode OLED of FIG. 2. The pixel electrode LE may be connected to the drain electrode DE through a contact hole defined through the first via insulating layer VIAL The light emitting layer EL may be disposed on the pixel electrode LE and emit light. The common electrode UE may be disposed on an intermediate layer EL while covering the pixel defining layer PDL.

In an embodiment, the pixel electrode LE and the common electrode UE may include a conductive material. The light emitting layer EL may have a structure in which a hole injection layer, a hole transport layer, an organic light emitting layer, an electron transport layer, and an electron injection layer are laminated one on another.

The encapsulation layer may be disposed on the light emitting element ED. The encapsulation layer may serve to protect the light emitting element ED from external substances. The first sub-encapsulation layer SEN1 may be disposed on the common electrode UE. The third sub-encapsulation layer SEN3 may be disposed on the first sub-encapsulation layer SEN1. The first sub-encapsulation layer SEN1 and the third sub-encapsulation layer SEN3 may include an inorganic insulating material. The second sub-encapsulation layer SEN2 may be disposed between the first sub-encapsulation layer SEN1 and the third sub-encapsulation layer SEN3. The second sub-encapsulation layer SEN2 may have a thickness relatively thicker than those of the first sub-encapsulation layer SEN1 and the third sub-encapsulation layer SEN3. The second sub-encapsulation layer SEN2 may have a flat top surface. The second sub-encapsulation layer SEN2 may include an organic insulating material. In such an embodiment, the encapsulation layer may be disposed at an outer side thereof with an inorganic insulating material having resistant to an impact. Accordingly, the encapsulation layer may protect the light emitting element ED from external impact.

Figure 4:
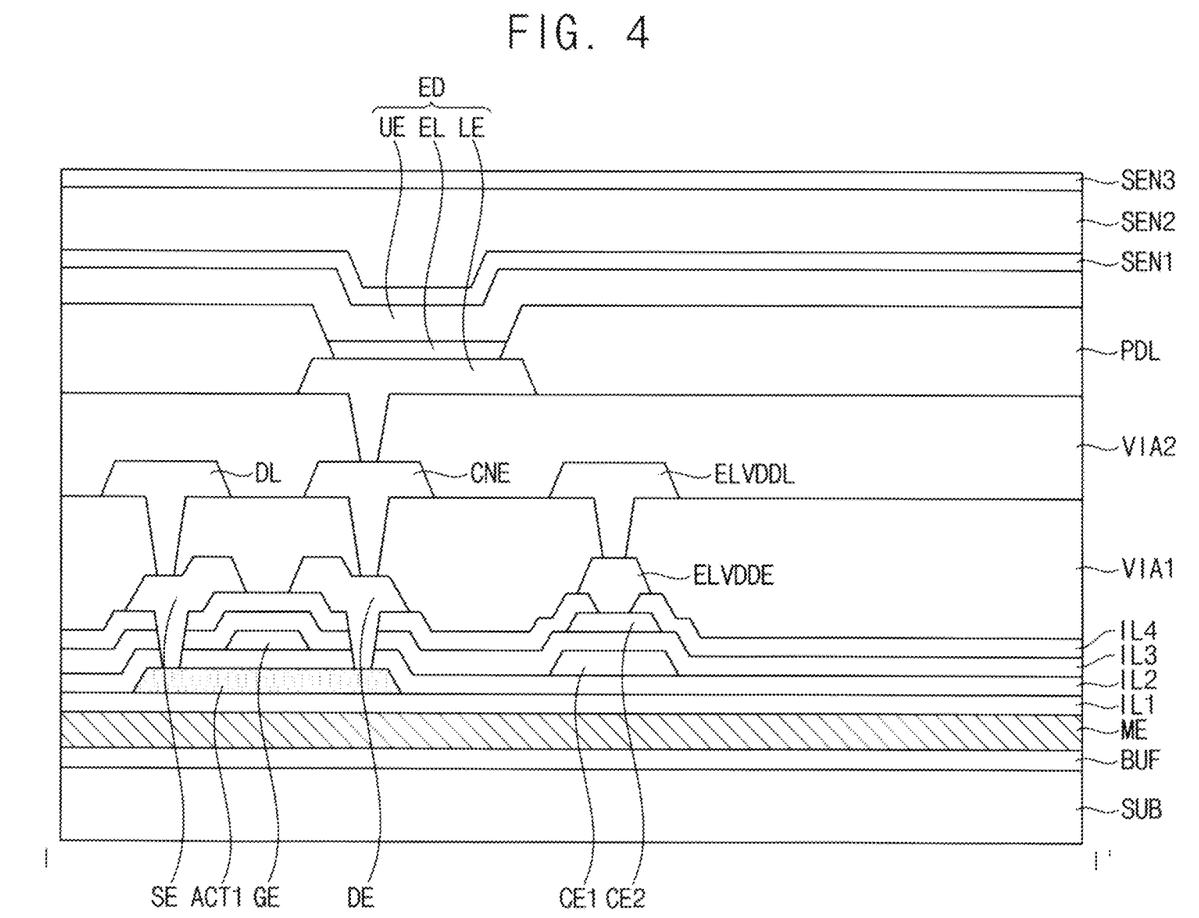
FIG. 4 is a cross-sectional view taken along line I-I' of FIG. 1 showing an alternative embodiment of a display device.

FIG. 4 is a cross-sectional view taken along line I-I' of FIG. 1 showing an alternative embodiment of a display device. The display device shown in FIG. 4 may be substantially the same as the display device shown in FIG. 3 except that one electrode layer and a second via insulating layer VIA2 are added. Accordingly, any repetitive detailed description of the same or like elements in FIG. 4 will hereinafter be omitted or simplified.

Referring to FIGS. 1 and 4, an embodiment of the display device DD may include a substrate SUB, a buffer layer BUF, a lower electrode layer ME, a first insulating layer ILL a second insulating layer IL2, a third insulating layer IL3, a fourth insulating layer IL4, a first via insulating layer VIA1, a source electrode SE, a drain electrode DE, a gate electrode GE, an active layer ACT, a first capacitor electrode CE1, a second capacitor electrode CE2, a high power voltage electrode ELVDDE, a high power voltage line ELVDDL, a light emitting diode ED, a pixel defining layer PDL, an encapsulation layer, a data line DL, a contact electrode CNE, a high power voltage line ELVDDL, and a second via insulating layer VIA2.

In such an embodiment, one electrode layer including the data line DL, the contact electrode CNE and the high power voltage line ELVDDL may be disposed on the first via insulating layer VIA1.

The data line DL may be electrically connected to the source electrode SE through a contact hole defined through the first via insulating layer VIAL The data line DL may transmit a signal to the source electrode SE. In one embodiment, for example, the data line DL may provide a data signal DATA to the source electrode SE. The data line DL may include a conductive material such as metal and alloy. In such an embodiment, the data line DL may include substantially the same materials as the source electrode SE.

The contact electrode CNE may be electrically connected to the drain electrode DE through a contact hole defined through the first via insulating layer VIAL The contact electrode CNE may transmit signals transmitted through the source electrode SE, the first active layer ACT1, and the drain electrode DE to the light emitting element ED. In such an embodiment, the light emitting element ED and the contact electrode CNE may be electrically connected to each other through a contact hole defined through the second via insulating layer VIA2. The contact electrode CNE may include a conductive material such as metal and alloy. In such an embodiment, the contact electrode CNE may include substantially the same materials as the data line DL.

The high power voltage ELVDD may be applied to the high power voltage line ELVDDL. The high power voltage line ELVDDL may be connected to the high power voltage electrode ELVDDE through a contact hole defined through the first via insulating layer VIAL Accordingly, the high power voltage ELVDD may also be applied to the high power voltage electrode ELVDDE and the second capacitor electrode CE2. In such an embodiment, the first capacitor electrode CE1 and the second capacitor electrode CE2 may form the storage capacitor CST.

Figure 5:
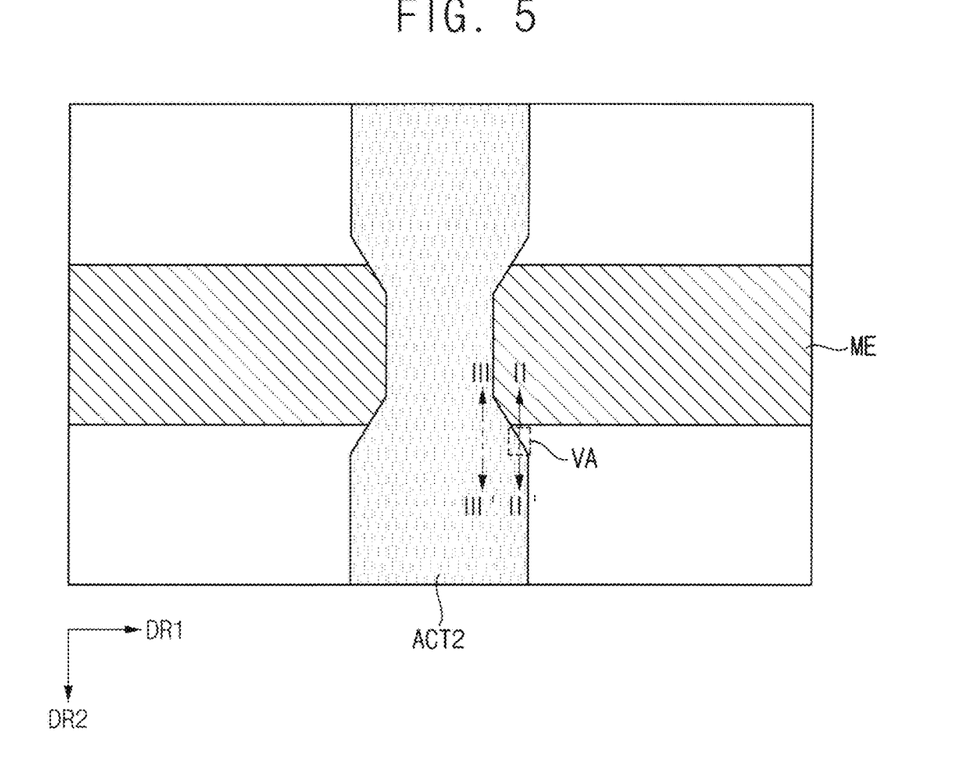
FIG. 5 is a plan view showing an embodiment of a lower electrode and an active layer included in the display device of FIG. 1.
Figure 6:
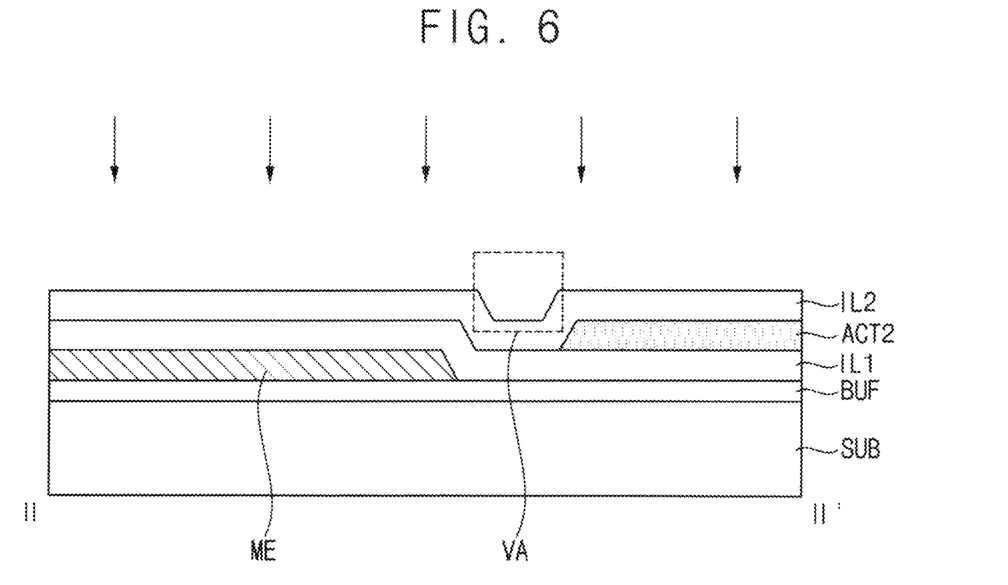
FIGS. 6 to 9 are cross-sectional views taken along line II-II' of FIG. 5.
Figure 7:
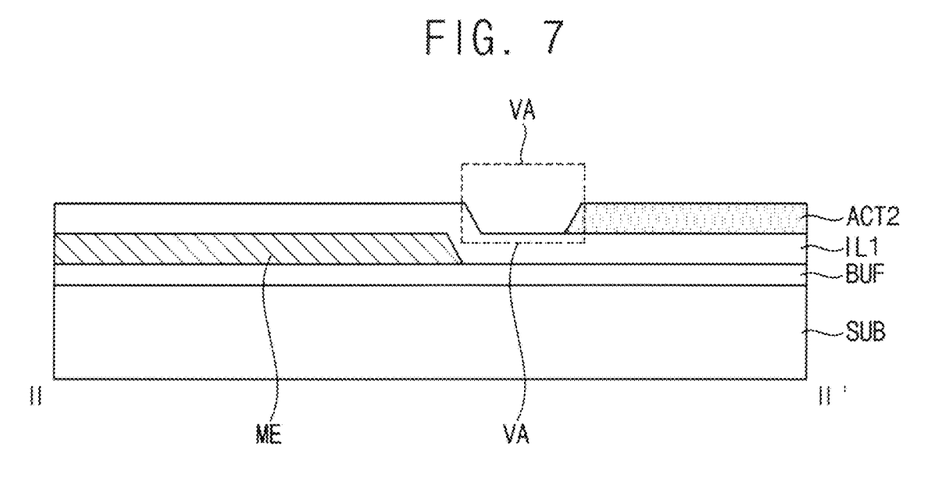
Figure 8:
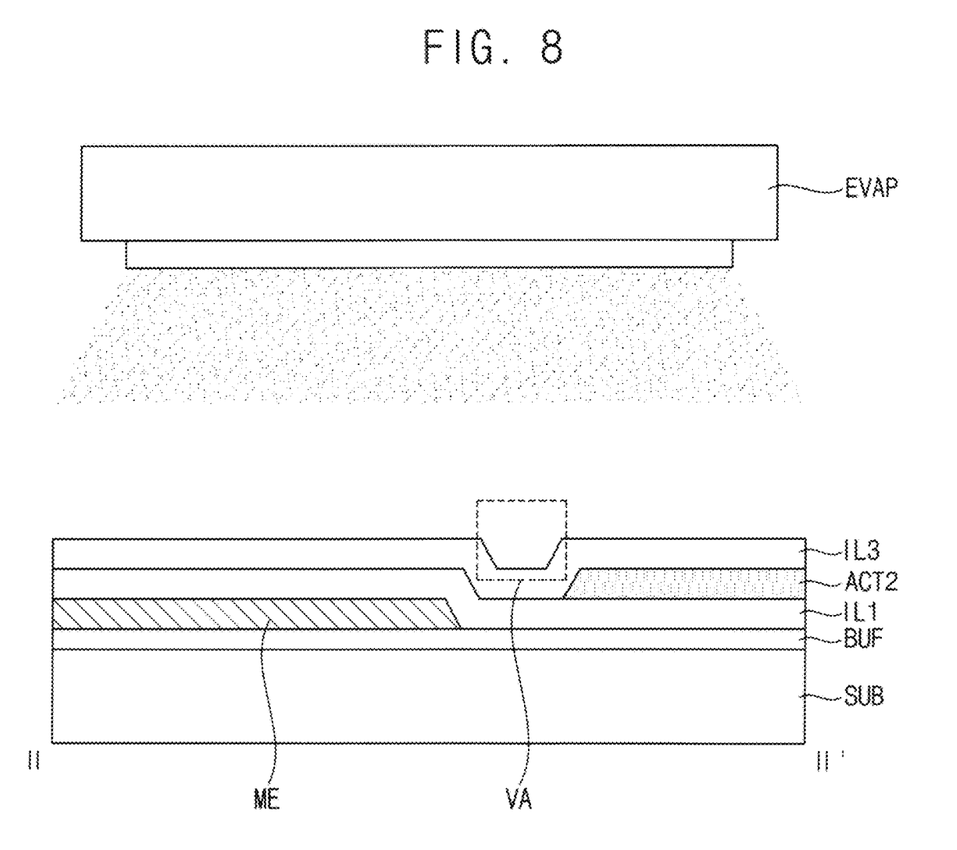
Figure 9:
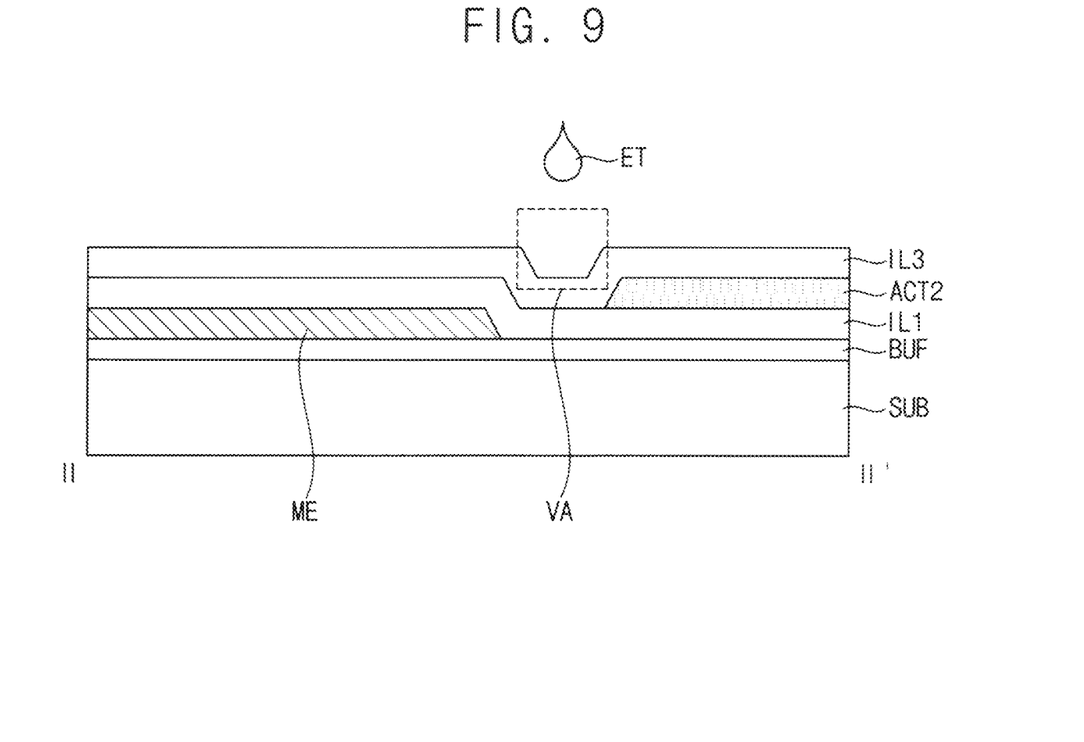

FIG. 5 is a plan view showing an embodiment of a lower electrode and an active layer included in the display device of FIG. 1.

Referring to FIGS. 1 and 5, an embodiment of the display device DD may include the lower electrode ME and a second active layer ACT2. The second active layer ACT2 may be disposed on the lower electrode ME. The second active layer ACT2 may be disposed in a same layer as the first active layer ACT1, and include substantially the same material as the first active layer ACT1. The second active layer ACT2 may overlap at least a part of the lower electrode ME. In one embodiment, for example, the second active layer ACT2 may be disposed on the lower electrode ME to cross the lower electrode ME.

The lower electrode ME may include a conductive material such as metal and alloy. The lower electrode ME may reflect light. In an embodiment, a width of the second active layer ACT2 may be reduced in an area of the second active layer ACT2 overlapping the lower electrode ME in the process of forming the second active layer ACT2 by light reflectivity of the conductive material.

In one embodiment, for example, light provided during exposure process may be reflected by the lower electrode ME, and thus an amount of exposure to the second active layer ACT2 may be increased. Accordingly, the width of the second active layer ACT2 may be reduced in the area of the second active layer ACT2 overlapping the lower electrode ME.

In such an embodiment, a step structure may be formed in the second active layer ACT2 in the area overlapping the lower electrode ME, so that the width of the second active layer ACT2 may be reduced in the area of the second active layer ACT2 overlapping the lower electrode ME.

Accordingly, when a separate layer disposed on the second active layer ACT2 is patterned using an etching solution, a part of the second active layer ACT2 may be undesirably etched together, which will be described later in greater detail.

FIGS. 6 to 9 are cross-sectional views taken along line II-II' of FIG. 5.

Referring to FIGS. 6 to 9, in an embodiment, the second insulating layer IL2 may be disposed on the first insulating layer IL1 while covering the second active layer ACT2. In such an embodiment, as shown in FIG. 3, the second insulating layer IL2 may cover the first active layer ACT1.

Since the area of the second active layer ACT2 overlapping the lower electrode ME has a width narrower than other areas, the second insulating layer IL2 may be formed with a concave portion VA in a portion adjacent to the lower electrode ME and the second active layer ACT2.

Then, the second insulating layer IL2 may be removed by an etching process. The second active layer ACT2 is amplified by the etching process, so that the second active layer ACT2 may have electrical conductivity.

Then, the third insulating layer IL3 may be formed on the first insulating layer IL1 while covering the second active layer ACT2 by a deposition process. In such an embodiment, the first active layer ACT1 may be disposed in contact with the second insulating layer IL2, and the second active layer ACT2 may be disposed in contact with the third insulating layer IL3. A deposition apparatus EVAP including deposition materials may form the third insulating layer IL3 through a chemical vapor deposition process. Due to the structural characteristics of the concave portion VA, the deposition materials may not permeate into the concave portion VA. Accordingly, the deposition process may be relatively less performed in the concave portion VA.

In this case, foreign substances may be introduced into the concave portion VA and thus the second active layer ACT2 may be damaged. In one embodiment, for example, an etchant ET for etching the source electrode SE, the drain electrode DE, and the high power voltage electrode ELVDDE may permeate into the second active layer ACT2 through the concave portion VA, and accordingly the second active layer ACT2 may be damaged. Accordingly, the width of the second active layer ACT2 is desired to be increased in the area in which the second active layer ACT2 and the lower electrode ME start to overlap each other in order to prevent the second active layer ACT2 from being damaged.

Figure 10:
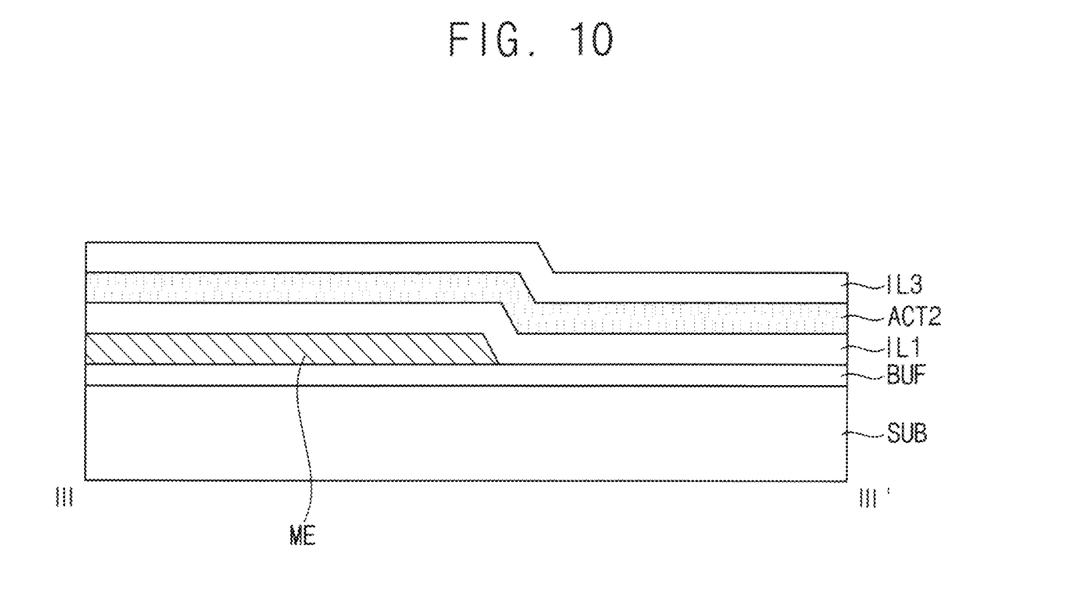
FIG. 10 is a cross-sectional view taken along line III-III' of FIG. 5.

FIG. 10 is a sectional view taken along line III-III' of FIG. 5.

Referring to FIGS. 1, 5 and 10, the concave portion VA may not be formed in the display device DD. In one embodiment, for example, in the second active layer ACT2, the portion VA may not be formed in an area having a constant width in the second direction DR2. Accordingly, the second active layer ACT2 may not be damaged by foreign substances. Accordingly, the second active layer ACT2 and the third insulating layer IL3 covering the second active layer ACT2 may be formed substantially uniformly.

Figure 11:
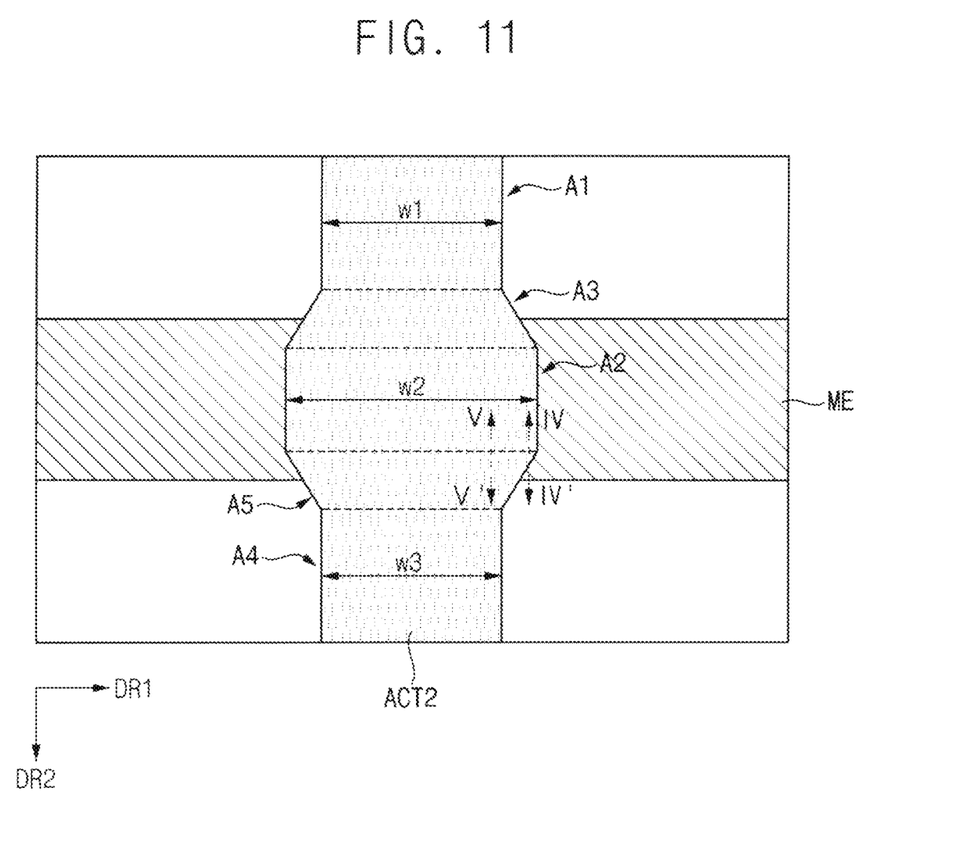
FIG. 11 is a plan view showing an embodiment of the lower electrode and the active layer included in the display device of FIG. 1.

FIG. 11 is a plan view showing an alternative embodiment of the lower electrode and the active layer included in the display device of FIG. 1.

Referring to FIGS. 1 and 11, an embodiment of the display device DD may include the lower electrode ME and a second active layer ACT2. The second active layer ACT2 may be disposed on the lower electrode ME. The second active layer ACT2 may be disposed in a same layer as the first active layer ACT1, and may include substantially the same material as the first active layer ACT1. The second active layer ACT2 may overlap at least a part of the lower electrode ME. In one embodiment, for example, the second active layer ACT2 may be disposed on the lower electrode ME to cross the lower electrode ME.

The lower electrode ME may include a conductive material such as metal and alloy. The lower electrode ME may reflect light. In such an embodiment, the width of the second active layer ACT2 may be reduced in an area of the second active layer ACT2 overlapping the lower electrode ME in the process of forming the second active layer ACT2 by light reflectivity of the conductive material.

In one embodiment, for example, the lower electrode ME may reflect the light provided during the exposure process, so that the amount of exposure to the second active layer ACT2 may be increased. Accordingly, the width of the second active layer ACT2 may be reduced in the area of the second active layer ACT2 overlapping the lower electrode ME.

In such an embodiment, a step structure is formed in the second active layer ACT2 in the area overlapping the lower electrode ME, so that the width of the second active layer ACT2 may be reduced in the area of the second active layer ACT2 overlapping the lower electrode ME.

Accordingly, when the separate conductive layer is formed on the second active layer ACT2 and patterned by the etching solution, a part of the second active layer ACT2 may be undesirably etched together.

According to an embodiment of the display device DD, the area of the second active layer ACT2 overlapping the lower electrode ME may be formed to have a relatively wide width to prevent a part of the second active layer ACT2 from being undesirably etched. Accordingly, in an embodiment of the display device DD, the concave portion VA described above may not be formed even when light is reflected by the lower electrode ME while the second active layer ACT2 is exposed.

In one embodiment, for example, the second active layer ACT2 may extend in a second direction DR2 perpendicular to the first direction DR1. The second active layer ACT2 may include a first area A1 having a first width w1 in the first direction DR1. The second active layer ACT2 may include a second area A2 having a second width W2 in the first direction DR1. The second area A2 may overlap the lower electrode ME. The second width w2 may be wider than the first width w1. In such an embodiment, the second active layer ACT2 may include a third area A3 connected between the first area A1 and the second area A2. The width of the third area A3 in the first direction DR1 may be increased toward the second direction DR2. In such an embodiment, the width of the third area A3 in the first direction DR1 may be increased as being away from the first area A1 to the second area A2. In such an embodiment, at least a part of the third area A3 may overlap the lower electrode ME.

Accordingly, in an embodiment of the display device DD, the above-mentioned concave portion may not be formed in the area in which the lower electrode ME and the second active layer ACT2 intersect and overlap each other. Accordingly, the second active layer ACT2 may not be damaged.

In such an embodiment, the second active layer ACT2 may include a fourth area A4 having a third width w3 in the first direction DR1. The second active layer ACT2 may include a fifth area A5 connected between the fourth area A4 and the second area A2. A width of the fifth area A5 in the first direction DR1 may be increased toward a direction opposite to the second direction DR2. In such an embodiment, the width of the fifth area A5 in the first direction DR1 may be increased as being away from the fourth area A4 to the second area A2.

In an embodiment, the first width w1 may be substantially the same as the third width w3. Alternatively, the first width w1 and the third width w3 may be different from each other.

An embodiment of the display device DD according to the invention may have the second width w2 wider than the first width w1 and the third width w3. Accordingly, the concave portion may not be formed in the area adjacent to the second active layer ACT2 and the lower electrode ME. Thus, the overall uniform second active layer ACT2 and the third insulating layer IL3 covering the second active layer ACT2 may be formed.

Figure 12:
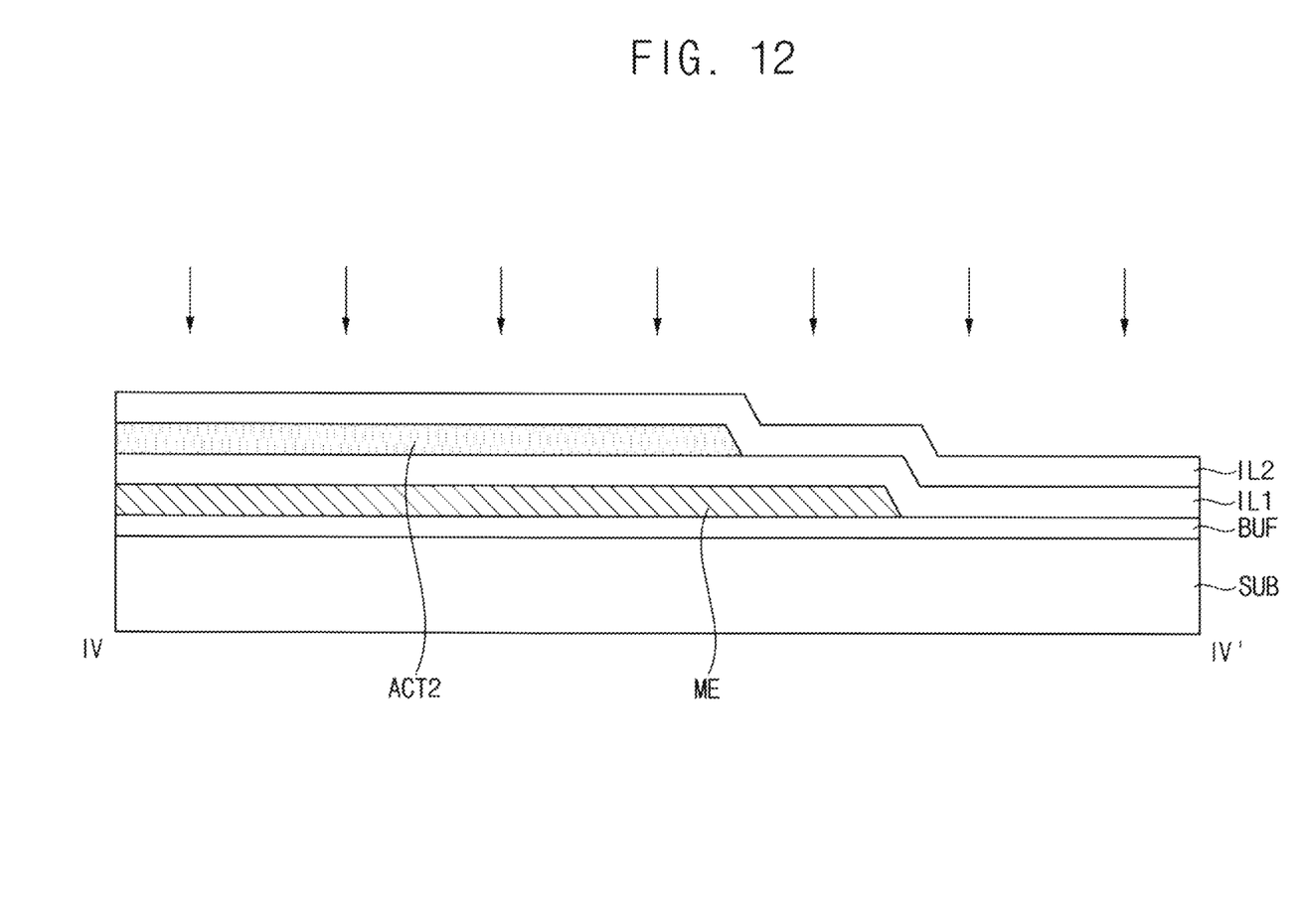
FIGS. 12 to 14 are sectional views showing embodiments taken along line IV-IV' of FIG. 11.
Figure 13:
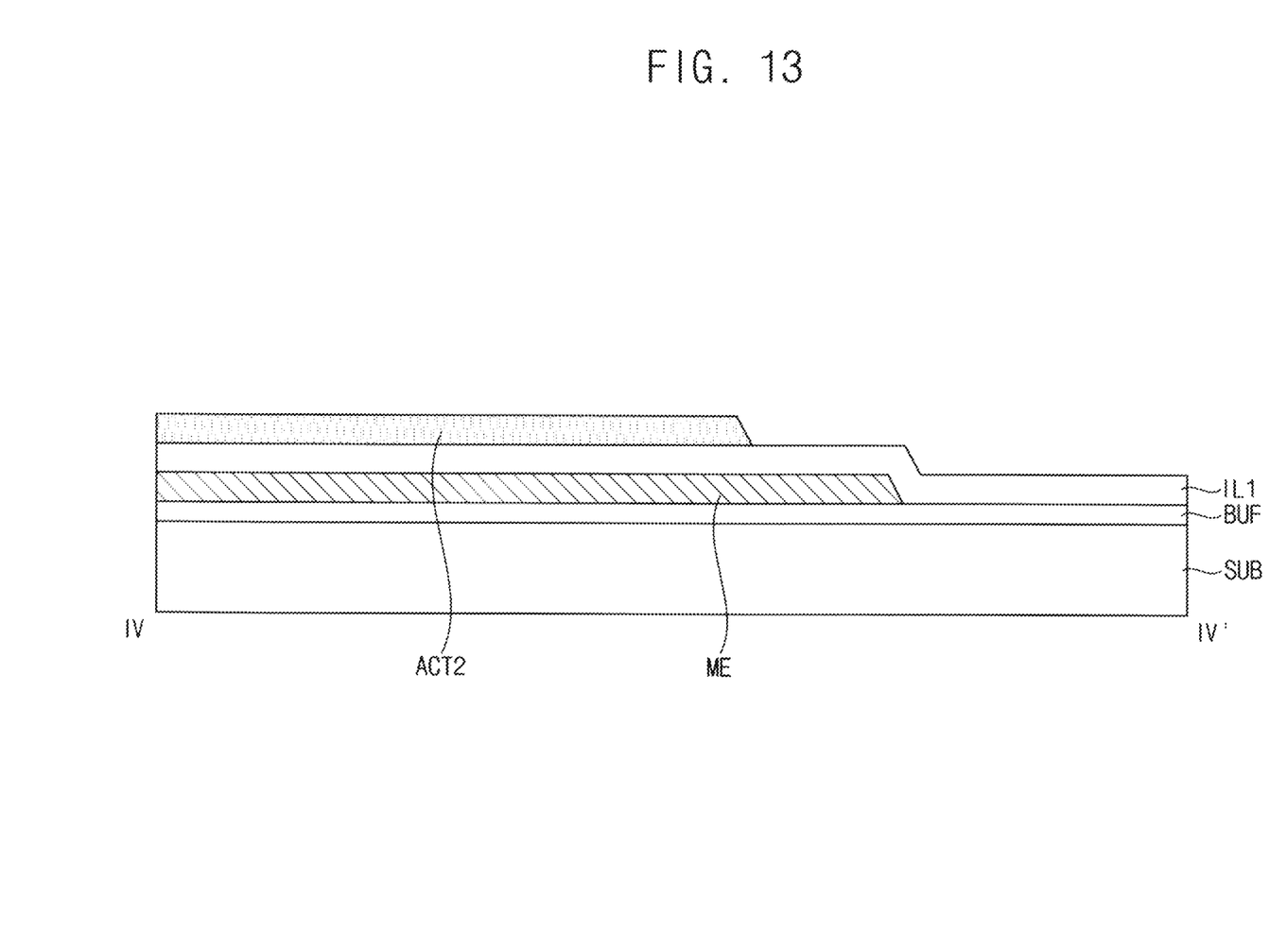
Figure 14:
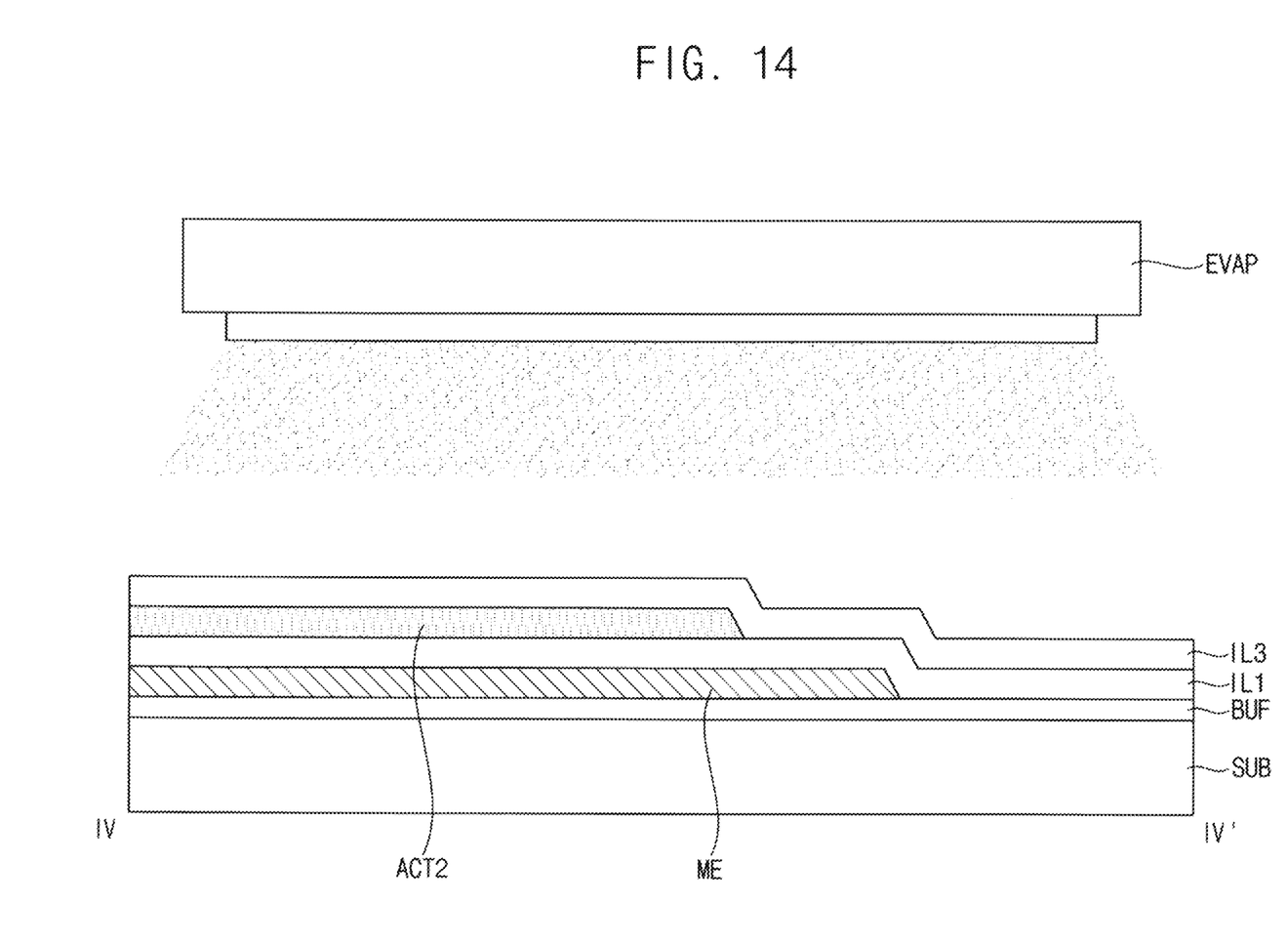

FIGS. 12 to 14 are cross-sectional views taken along line IV-IV' of FIG. 10.

Referring to FIGS. 1 and 11 to 14, in an embodiment of the display device DD, a second insulating layer IL2 may be formed to cover the second active layer ACT2. Then, as shown in FIG. 12, an etching process of etching the second insulating layer IL2 may be performed. In such an embodiment, the second active layer ACT2 is amplified by the etching process, so that the second active layer ACT2 may have electrical conductivity. Accordingly, the second active layer ACT2 may transmit a signal to the pixels PX.

Then, as shown in FIG. 14, the third insulating layer IL3 may be formed on the first insulating layer IL1 to cover the second active layer ACT2. Since the concave portion may not be formed in the area in which the lower electrode ME overlaps the second active layer ACT2, the third insulating layer IL3 may be uniformly formed as a whole.

Accordingly, the second active layer ACT2 may have a relatively wide second width w2 in the area overlapping the lower electrode ME, and the width of the third area A3 in which the first area A1 is connected to the second area A2 may be gradually increased in the second direction DR2. Thus, the concave portion may not be formed between the lower electrode ME and the second active layer ACT2, and the second active layer ACT2 may not be damaged by the etching solution or the like.

Figure 15:
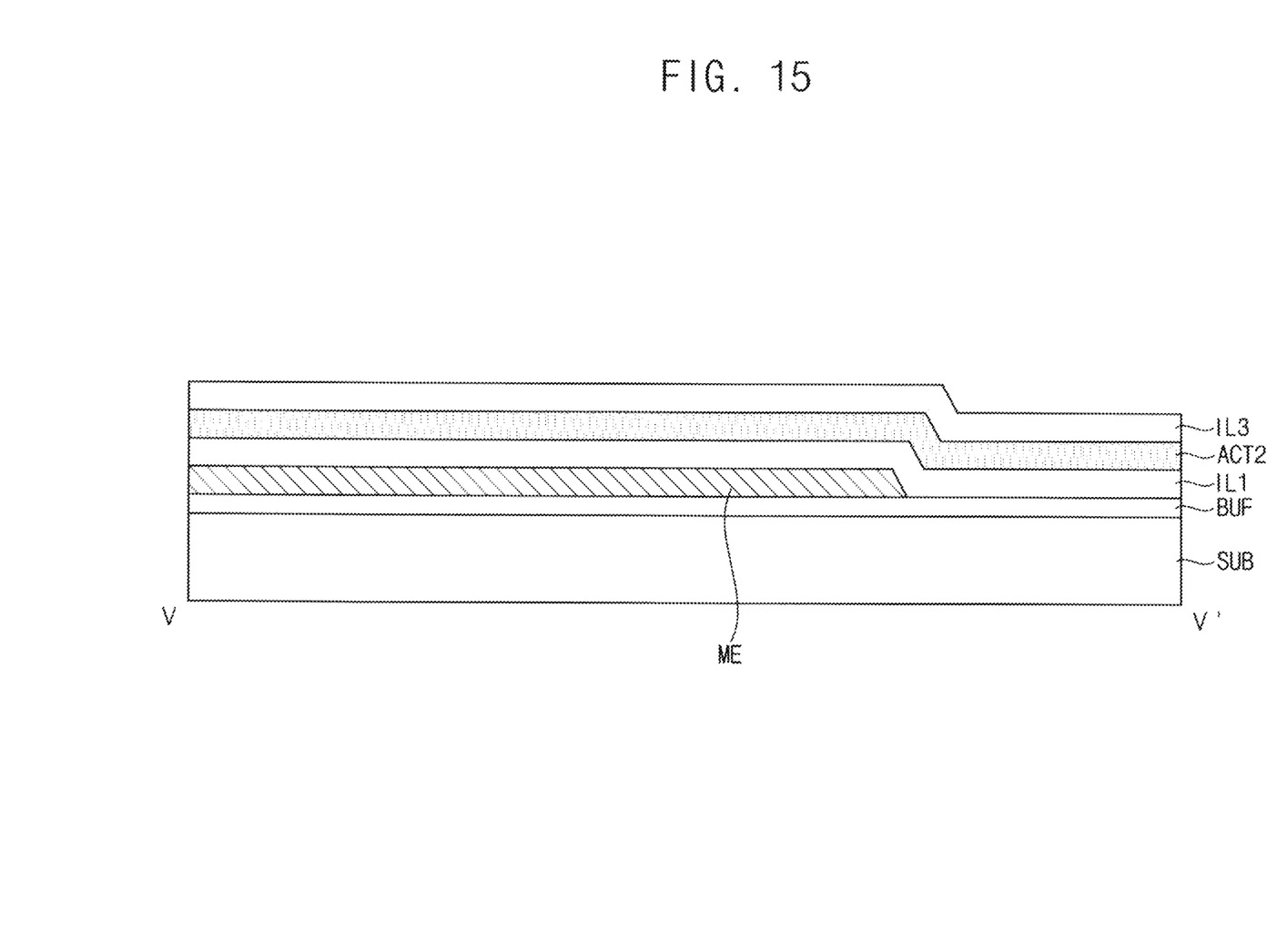
FIG. 15 is a sectional view showing embodiments taken along line V-V' of FIG. 11.

FIG. 15 is a cross-sectional view taken along line V-V' of FIG. 10.

Referring to FIGS. 1, 10 and 14, the concave portion VA may not be formed in the display device DD. In one embodiment, for example, in the second active layer ACT2, the concave portion VA may not be formed in an area having a constant width in the second direction DR2. Accordingly, the second active layer ACT2 may not be damaged by foreign substances. Thus, the overall uniform second active layer ACT2 and the third insulating layer IL3 covering the second active layer ACT2 may be formed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a lower electrode extending in a first direction; and
    a first active layer disposed on the lower electrode and extending in a second direction perpendicular to the first direction, wherein
    the first active layer includes:
        a first area having a first width in the first direction;
        a second area having a second width wider than the first width in the first direction, and overlapping the lower electrode; and
        a third area between the first area and the second area and connecting the first area to the second area.

2. The display device of claim 1, wherein the third area has a width in the first direction increasing as being away from the first area to the second area.

3. The display device of claim 1, wherein the third area partially overlaps the lower electrode.

4. The display device of claim 1, wherein
    the first active layer includes an oxide-based semiconductor material, and
    the lower electrode includes copper and titanium.

5. The display device of claim 4, wherein the first active layer includes indium-gallium-zinc oxide.

6. The display device of claim 4, wherein the first active layer has electrical conductivity as a whole.

7. The display device of claim 1, wherein the first active layer further includes:
    a fourth area spaced apart from the third area by the second area; and
    a fifth area between the second area and the fourth area and connecting the second area and the fourth area to each other.

8. The display device of claim 7, wherein at least a part of the fifth area overlaps the lower electrode.

9. The display device of claim 7, wherein
    the fourth area has a third width in the first direction smaller than the second width, and
    the fifth area has a width in the first direction increasing as being away from the fourth area to the second area.

10. The display device of claim 9, wherein the first width and the third width are substantially the same as each other.

11. The display device of claim 9, wherein the first width and the third width are different from each other.

12. The display device of claim 1, further comprising:
    a second active layer disposed in a same layer as the first active layer;
    a first insulating layer in contact with the second active layer and disposed while covering the second active layer;
    a gate electrode disposed on the first insulating layer and partially overlapping the second active layer; and
    a second insulating layer disposed on the first insulating layer while covering the gate electrode.

13. The display device of claim 12, wherein the second insulating layer is in contact with the first active layer, and covers the first active layer.

14. The display device of claim 12, wherein the second active layer includes an oxide-based semiconductor material.

15. The display device of claim 14, wherein the second active layer includes indium-gallium-zinc oxide.

16. The display device of claim 12, wherein the first active layer includes:
    a center portion overlapping the gate electrode; and
    first and second end portions spaced apart from each other with the center portion therebetween, and having electrical conductivity.

17. The display device of claim 16, wherein the first and second end portions of the second active layer are electrically connected to each other through the center portion when a signal is applied to the gate electrode.

18. The display device of claim 12, further comprising:
    a drain electrode connected to the second active layer; and
    a light emitting element connected to the drain electrode.

19. The display device of claim 18, further comprising:
    a contact electrode between the drain electrode and the light emitting element and connecting the drain electrode and the light emitting element to each other.

* * * * *